United States Patent
Seo et al.

(10) Patent No.: US 7,250,633 B2
(45) Date of Patent: Jul. 31, 2007

(54) GALLIUM NITRIDE-BASED LIGHT EMITTING DEVICE HAVING ESD PROTECTION CAPACITY AND METHOD FOR MANUFACTURING THE SAME

(75) Inventors: Jun Ho Seo, Kyungki-do (KR); Suk Kil Yoon, Kyungki-do (KR); Seung Wan Chae, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 12 days.

(21) Appl. No.: 11/220,844

(22) Filed: Sep. 8, 2005

(65) Prior Publication Data
US 2006/0157718 A1    Jul. 20, 2006

(30) Foreign Application Priority Data
Jan. 19, 2005    (KR) .................... 10-2005-0005138

(51) Int. Cl.
*H01L 27/15* (2006.01)
(52) U.S. Cl. ........................ 257/82; 257/E33
(58) Field of Classification Search ............. 257/82, 257/E33
See application file for complete search history.

(56) References Cited
U.S. PATENT DOCUMENTS

| | | | |
|---|---|---|---|
| 6,340,824 B1 * | 1/2002 | Komoto et al. ............. 257/99 |
| 6,593,597 B2 | 7/2003 | Sheu | |
| 6,674,097 B2 * | 1/2004 | Komoto et al. ............. 257/98 |
| 6,838,703 B2 * | 1/2005 | Yamaguchi et al. .......... 257/94 |
| 2005/0077536 A1 * | 4/2005 | Choi et al. ................ 257/103 |

* cited by examiner

*Primary Examiner*—Matthew Smith
*Assistant Examiner*—Ankush Singal
(74) *Attorney, Agent, or Firm*—McDermott Will & Emery LLP

(57) ABSTRACT

A gallium nitride-based light emitting device, and a method for manufacturing the same are disclosed. The light emitting device comprises an n-type GaN-based clad layer, an active layer, a p-type GaN-based clad layer and a p-side electrode sequentially stacked on a substrate. The device further comprises an n-side electrode formed on one region of the n-type GaN-based clad layer, and two or more MIM type tunnel junctions formed on the other regions of the n-type GaN-based clad layer. Each of the MIM type tunnel junctions comprises a lower metal layer formed on the GaN-based clad layer so as to contact the n-type GaN-based clad layer, an insulating film formed on the lower metal layer, and an upper metal layer formed on the insulating film. The device is protected from reverse ESD voltage, so that tolerance to reverse ESD voltage can be enhanced, thereby improving reliability of the device.

14 Claims, 7 Drawing Sheets

GALLIUM NITRIDE-BASED LIGHT EMITTING DEVICE HAVING ESD PROTECTION CAPACITY AND METHOD FOR MANUFACTURING THE SAME

RELATED APPLICATION

The present invention is based on, and claims priority from, Korean Application Number 2005-0005138, filed Jan. 19, 2005, the disclosure of which is incorporated by reference herein in its entirety.

BACKGROUND OF THE INVENTION

1. Field of the Invention

The present invention generally relates to a gallium nitride-based light emitting device and a method for manufacturing the same, and, more particularly, to a gallium nitride-based light emitting device, designed to have enhanced tolerance to reverse electrostatic discharge (ESD), and a method for manufacturing the same.

2. Description of the Related Art

Generally, a conventional gallium nitride-based light emitting device comprises a buffer layer, an n-type GaN-based clad layer, an active layer, and a p-type GaN-based clad layer sequentially stacked on a dielectric sapphire substrate in this order. Additionally, a transparent electrode and a p-side electrode are sequentially formed on the p-type GaN-based clad layer, and an n-side electrode is formed on a portion of the n-type GaN-based clad layer exposed by mesa etching. In such a conventional gallium nitride-based light emitting device, holes from the p-side electrode and electrons from the n-side electrode are coupled to emit light corresponding to energy band gap of a composition of the active layer.

Although the gallium nitride-based light emitting device has a significantly large energy band gap, it is vulnerable to electrostatic discharge due to its negative crystallinity. In particular, as the amount of crystal defects is increased, the light emitting device is more vulnerable to the electrostatic discharge. Specifically, the gallium nitride-based light emitting device based on a material having the formula $Al_xGa_yIn_{1-x-y}N$ ($0 \leq x \leq 1$, $0 \leq y \leq 1$) has a tolerance voltage of about 1 to 3 kV against forward ESD, and a tolerance voltage of about 100 V to 1 kV against reverse ESD. As such, the gallium nitride-based light emitting device is more vulnerable to the reverse ESD rather than the forward ESD. Thus, when a large reverse ESD voltage is applied in a pulse shape to the gallium nitride-based light emitting device, the light emitting device is deteriorated or damaged. For example, when the light emitting device is brought into contact with a person's body, or inserted into or drawn from a socket, a reverse ESD voltage of 10 kV or more is applied to the gallium nitride-based light emitting device. As a result, such a reverse ESD phenomenon damages reliability of the gallium nitride-based light emitting device as well as causing a sharp reduction in life span thereof.

In order to solve the above mentioned problem, several approaches for enhancing the tolerance voltage of the gallium nitride-based light emitting device against ESD have been proposed. For example, there is a method of enhancing the tolerance voltage of the light emitting device to ESD by optimizing the structure of the light emitting device, and process of manufacturing the same. However, with this method, there is a limitation in achieving desired tolerance to ESD. As another method, a light emitting diode (which will be referred to as hereinafter "LED") of flip-chip structure is connected in parallel to a Si-based Zener diode so as to protect the light emitting device from ESD. However, in this method, an additional Zener diode must be purchased, and then assembled thereto by bonding, thereby significantly increasing material costs and manufacturing costs as well as restricting miniaturization of the device. As yet another method, U.S. Pat. No. 6,593,597 discloses technology for protecting the light emitting device from ESD by integrating an LED and a Schottky diode on an identical substrate and connecting them in parallel.

FIG. 1a is a cross-sectional view illustrating a conventional gallium nitride-based light emitting device having a Schottky diode connected in parallel as described above, and FIG. 1b is an equivalent circuit diagram of FIG. 1a. Referring to FIG. 1a, an LED structure of the conventional light emitting device comprises a first nucleus generation layer 102a, a first conductive buffer layer 104a, a lower confinement layer 106, an active layer 108, an upper confinement layer 110, a contact layer 112, a transparent electrode 114, and an n-side electrode 116 on a transparent substrate 100. Independent of the LED structure, a Schottky diode of the light emitting device comprises a second nucleus generation layer 102b and a second conductive buffer layer 104b formed on the transparent substrate 100, and a Schottky contact electrode 118 and an ohmic contact electrode 120 formed on the second conductive buffer layer 104b.

The transparent electrode 114 of the LED structure is connected to the ohmic contact electrode 120, and the n-side electrode 116 of the LED structure is connected to the Schottky contact electrode 118. As a result, as shown in FIG. 1b, the light emitting device has a structure wherein the LED is connected to the Schottky diode in parallel. In the light emitting device constructed as described above, when a high reverse voltage, for example, a reverse ESD voltage is instantaneously applied thereto, the high voltage can be discharged through the Schottky diode. Accordingly, most currents flow through the Schottky diode rather than the LED, thereby reducing damage of the light emitting device.

However, the method of protecting the light emitting device from ESD using the Schottky diode has a drawback of complicated manufacturing process. In other words, not only a region for LED must be divided from a region for the Schottky diode, but also it is necessary to deposit an additional electrode material in ohmic contact with an electrode material constituting the Schottky diode on the second conductive buffer layer 104b comprising n-type GaN-based materials. In particular, there are problems of limitation in selection of the metallic material forming Schottky contact between the n-type GaN-based materials, and of possibility of change in contact properties of semiconductor-metal in following processes, such as heat treatment.

SUMMARY OF THE INVENTION

The present invention has been made in view of the above problems, and it is an object of the present invention to provide a gallium nitride-based light emitting device, which has two or more metal-insulator-metal (MIM) type tunnel junctions on an n-type clad layer in a region separated from a region for an n-side electrode, thereby remarkably enhancing tolerance to reverse ESD, and a method for manufacturing the same.

In accordance with one aspect of the present invention, the above and other objects can be accomplished by the provision of a gallium nitride-based light emitting device comprising an n-type GaN-based clad layer, an active layer, a p-type GaN-based clad layer and a p-side electrode sequentially stacked on a substrate, the light emitting device further comprising: an n-side electrode formed on one region of the n-type GaN-based clad layer; and two or more MIM type tunnel junctions formed on the other regions of the n-type GaN-based clad layer and electrically connected to the n-side electrode while being spaced from the n-side electrode. Each of the MIM type tunnel junctions may comprise a lower metal layer formed on the GaN-based clad layer so as to contact the n-type GaN-based clad layer, an insulating film formed on the lower metal layer, and an upper metal layer formed on the insulating film. The upper metal layer may have a multilayer structure comprising two or more layers. The lower metal layer may comprise the same material as that of the n-side electrode.

When a reverse ESD voltage is applied to the light emitting device, the MIM type tunnel junctions allow tunneling of electrons therethrough. Thus, the light emitting device of the invention is prevented from being damaged by the reverse ESD voltage.

The light emitting device of the invention may further comprise a transparent electrode layer between the p-type GaN-based clad layer and the p-side electrode. In this case, the transparent electrode layer may extend to an upper surface of the insulating film, and constitute at least a portion of the upper metal layer. The upper metal layer may comprise a metal layer formed on the transparent electrode layer and composed of the same material as that of the p-side electrode. In this case, the upper metal layer of the MIM type tunnel junction constitutes a multilayer structure of transparent electrode layer/metal layer.

The upper electrode layer of the MIM type tunnel junction may comprise the same material as that of the p-side electrode. In this case, the lower electrode layer may comprise the same material as that of the n-side electrode, and the transparent electrode may be formed between the p-type GaN-based clad layer and the p-side electrode. Accordingly, each of the MIM type tunnel junctions may comprise the lower metal layer comprising the same material as that of the n-side electrode, the insulating film formed on the lower metal layer, and the upper metal layer formed on the insulating film and comprising the same material as that of the p-side electrode.

The two or more MIM type tunnel junctions may be spaced the same distance from the p-side electrode. In this manner, the MIM type tunnel junctions are spaced the same distance from the p-side electrode, thereby allowing a voltage applied to the n-side electrode to be further lowered upon application of an ESD voltage.

The p-side electrode may comprise at least one selected from the group consisting of Ti, Au, Ni, an alloy of Au and Al, an alloy of Au and Ti, an alloy of Au and Cu, a Mn-based alloy, a La-based alloy, a Ni-based alloy, and a Mg-based alloy. For example, the p-side electrode may comprise MnNi, LaNi$_5$, MgNi, ZnNi or ZnMg. The n-side electrode may comprise at least one selected from the group consisting of Cr, Ti, Ni, Au, Al, Ta, Hf, AuGe alloy, ZnO, and ITO. The transparent electrode layer may comprise at least one selected from the group consisting of ITO, SnO$_2$, Double layers of Ni/Au, an alloy of Ni and Au, ZnO, and MgO.

The insulating film of the MIM type tunnel junction may comprise one selected from the group consisting of silicon oxide, aluminum oxide, titanium oxide, silicon nitride and polyimide. The insulating film may have a thickness of 10 to 3,000 Å. Preferably, the insulating film may have a thickness of 100 to 1,000 Å.

In accordance with another aspect of the invention, there is provided a method for manufacturing a gallium nitride-based light emitting device, comprising the steps of: sequentially forming an n-type GaN-based clad layer, an active layer and a p-type GaN-based clad layer on a substrate; exposing a portion of the n-type GaN-based clad layer by mesa-etching some portion of the p-type GaN-based clad layer, active layer and n-type GaN-based clad layer; forming an n-side electrode on one region of the exposed n-type GaN-based clad layer; forming two or more lower metal layers on the other regions of the exposed GaN-based clad layer so as to be electrically connected to the n-type GaN-based clad layer while being separated from the n-side electrode; forming an insulating film on the lower metal layers; forming an upper metal layer on the insulating film; and forming a p-side electrode on the p-type GaN-based clad layer. The lower metal layers may comprise the same material as that of the n-side electrode. In this case, the step of forming the lower metal layers is simultaneously performed with the step of forming the n-side electrode.

A stack of the lower metal layers, insulating film, and upper metal layer constitutes an MIM type tunnel junction according to the invention. According to the method of the invention, two or more MIM type tunnel junctions are formed. The MIM type tunnel junctions of the invention provide a path for allowing passage of reverse current when a reverse ESD voltage is applied to the gallium nitride-based light emitting device.

The step of forming the upper metal layer on the insulating film may comprise forming a transparent electrode layer on the insulating film and the p-type GaN-based clad layer. In this case, the transparent electrode layer formed on the insulating film constitutes the upper metal layer or a portion of the upper metal layer.

The step of forming the upper metal layer on the insulating film may comprise forming a transparent electrode layer on the insulating film and the p-type GaN-based clad layer, and forming a metal layer comprising the same material as that of the p-side electrode on the transparent electrode layer in a region of the insulating film. In this case, formation of the metal layer comprising the same material as that of the p-side electrode may be simultaneously performed with the step of forming the p-side electrode. In this manner, the upper metal layer constitutes a multilayer structure of transparent electrode layer/metal layer.

The step of forming the upper metal layer on the insulating film may comprise forming a transparent electrode layer on the insulating film and the p-type GaN-based clad layer, selectively eliminating the transparent electrode layer so as to expose the insulating film, and forming a metal layer comprising the same material as that of the p-side electrode on the exposed insulating film. In this case, formation of the metal layer comprising the same material as that of the p-side electrode may be simultaneously performed with the step of forming the p-side electrode. In this manner, the metal layer comprising the same material as that of the p-side electrode constitutes the upper metal layer of the MIM type tunnel junction.

The method may further comprise forming a passivation film for protecting the gallium nitride-based light emitting device. In this case, the step of forming the passivation film may be performed simultaneously with the step of forming the insulating film.

The present invention provides the gallium nitride-based light emitting device having high tolerance to reverse ESD. In order to enhance tolerance to reverse ESD, the two or more MIM type tunnel junctions are formed at locations spaced from the n-side electrode on the n-type GaN-based clad layer. Each of the MIM type tunnel junctions has a multilayer structure of metal-insulator-metal, and allows reverse current to pass therethrough when a reverse ESD voltage is applied to the gallium nitride-based light emitting device. As a result, even though the reverse ESD voltage is applied thereto, the light emitting device is prevented from being damaged, thereby enhancing reliability of the device.

Additionally, according to the invention, the material for the n-side electrode, transparent electrode layer, the p-side electrode and passivation film of the light emitting device can be used as the material for the lower metal layers, the upper layer and the insulating film constituting the MIM type tunnel junctions without using other materials, thereby reducing the manufacturing costs. The light emitting device of the invention is a compound semiconductor light emitting device, and is formed of a GaN-based material. Here, the term "GaN-based material" means a material having the formula $Al_xGa_yIn_zN$ ($0 \leq x \leq 1$, $0 \leq y \leq 1$, $0 \leq z \leq 1$).

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
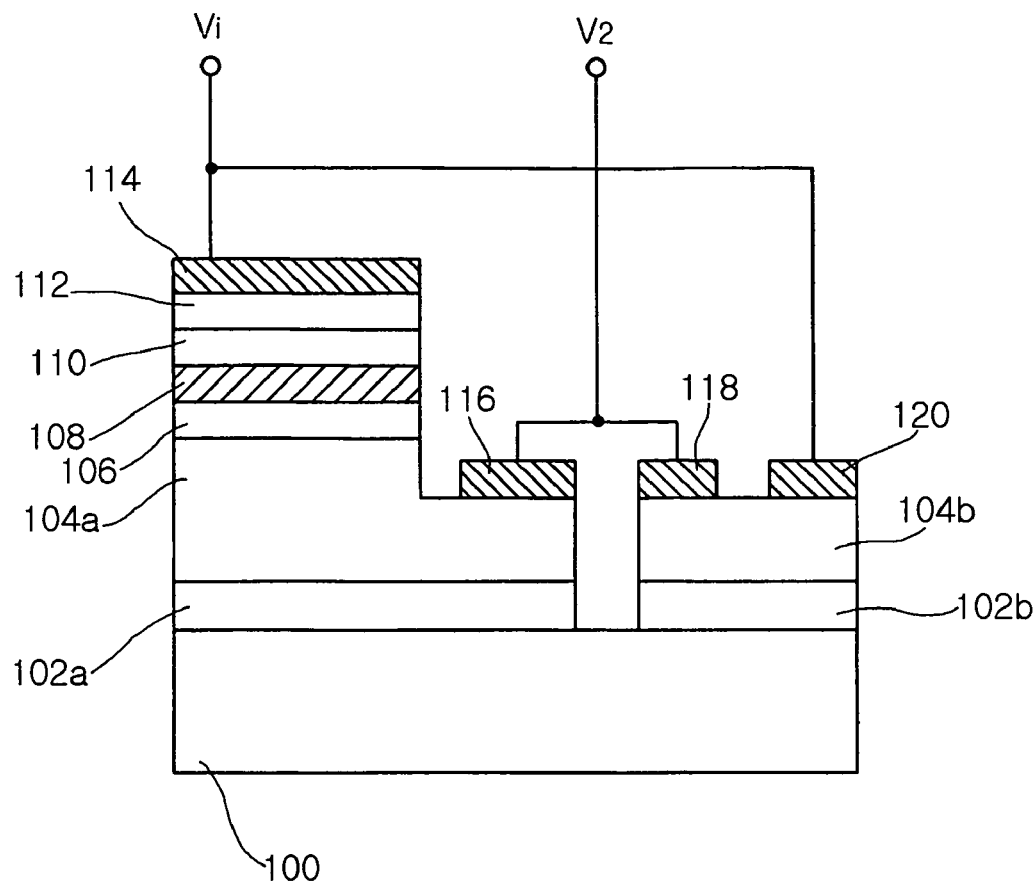
FIG. 1a is a cross-sectional view illustrating a conventional gallium nitride-based light emitting device having a Schottky diode connected in parallel.
Figure 1B:
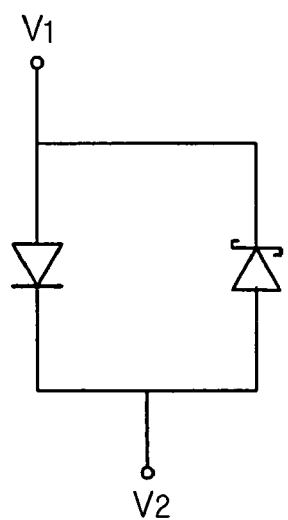
FIG. 1b is an equivalent circuit diagram of FIG. 1.

Preferred embodiments will now be described in detail with reference to the accompanying drawings. It should be noted that the embodiments of the invention can be modified in various shapes, and that the present invention is not limited to the embodiments described herein. The embodiments of the invention are described so as to enable those having an ordinary knowledge in the art to have a perfect understanding of the invention. Accordingly, shape and size of components of the invention are enlarged in the drawings for clear description of the invention. Like components are indicated by the same reference numerals throughout the drawings.

Figure 2:
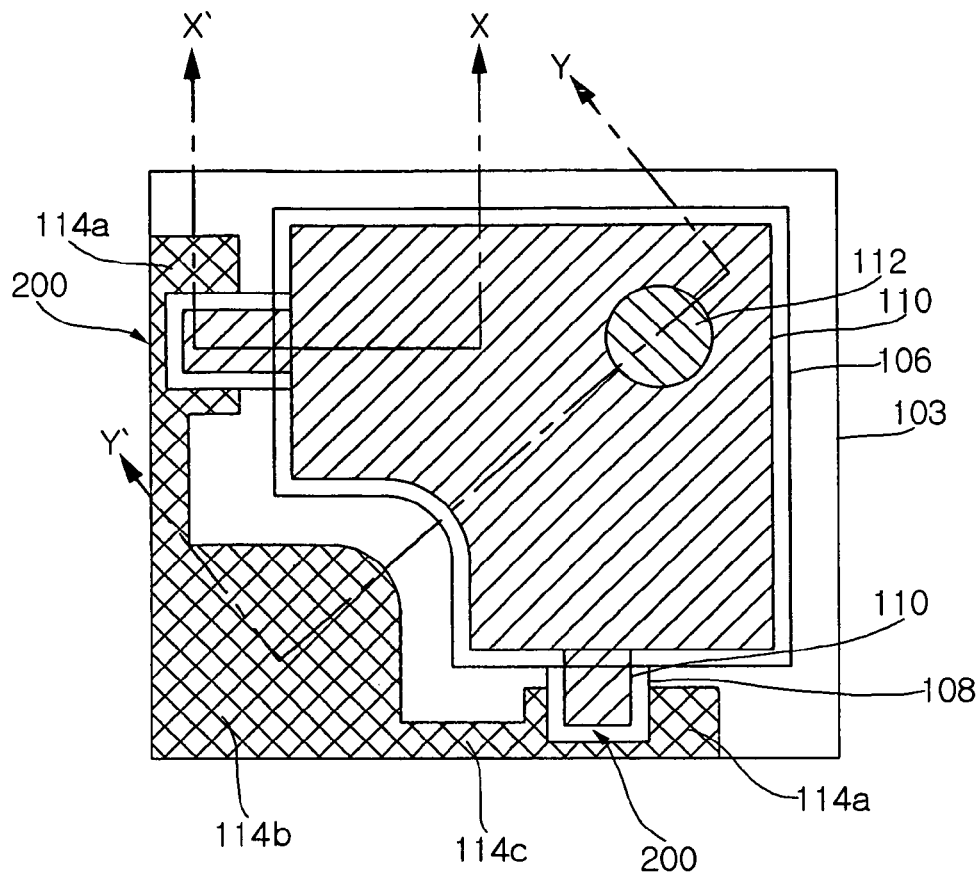
FIG. 2 is a plan view schematically illustrating a GaN-based light emitting device according to one preferred embodiment of the present invention.
Figure 3:
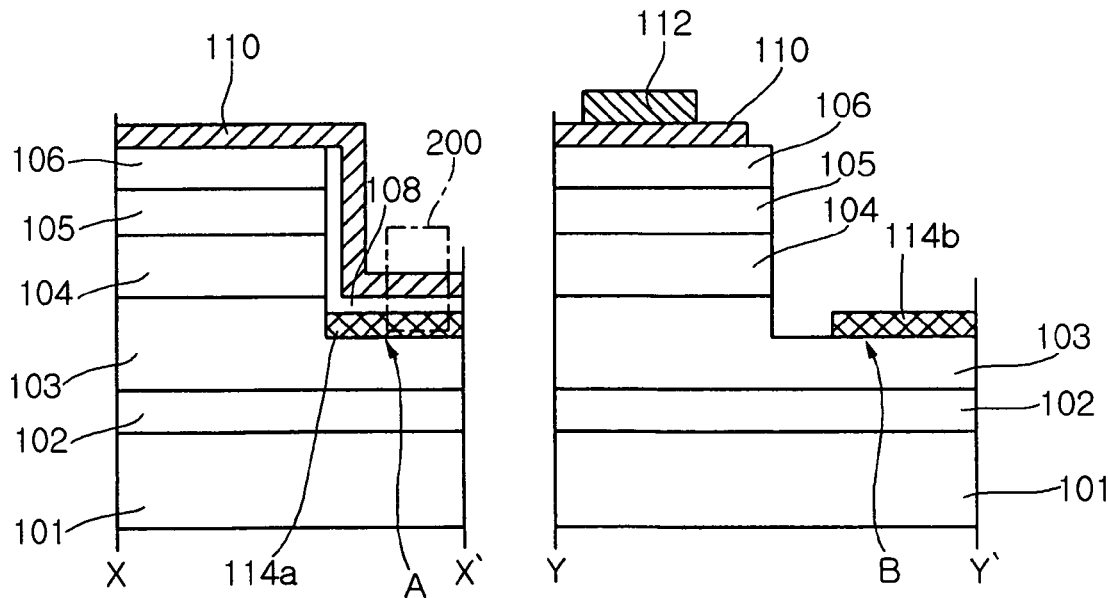
FIG. 3 are cross-sectional views taken along lines X-X' and Y-Y' of FIG. 2.

FIG. 2 is a plan view schematically illustrating a gallium nitride-based light emitting device 300 according to one embodiment of the invention, and FIG. 3 is cross-sectional views taken along lines X-X' and Y-Y' of FIG. 2. Referring to FIGS. 2 and 3, the light emitting device 300 comprises a buffer layer 102, an n-type GaN layer 103, an n-type AlGaN layer 104, an active layer 105 having the formula $Al_xGa_yIn_zN$ ($0 \leq x \leq 1$, $0 \leq y \leq 1$, $0 \leq z \leq 1$) and a multilayer structure, and a p-type AlGaN layer 106 sequentially stacked on a substrate 101 such as a sapphire substrate. Here, the n-type GaN layer 103 and the n-type AlGaN layer 104 constitute an n-type GaN-based clad layer, and the p-type AlGaN layer 106 constitutes a p-type GaN layer.

The stack has a mesa structure wherein some portion of the p-type AlGaN layer 106, active layer 105, n-type AlGaN layer 104 and n-type GaN layer 103 are removed to expose a portion of the n-type GaN layer 103. An n-side electrode 114b is formed on one region (region B of FIG. 3) of the exposed n-type GaN layer 103, and two or more MIM type tunnel junctions 200 are formed on the other regions (region A of FIG. 3) of the exposed GaN layer 103 so as to be spaced from the n-side electrode 114b. The two or more MIM type tunnel junctions 200 are electrically connected to the n-side electrode 114b via a wire 114c. A transparent electrode layer 110 is formed on the p-type AlGaN layer 106. A p-side electrode 112 constituting a pad electrode is formed on one side of the transparent electrode layer 110. In order to allow easy formation of ohmic contact between the electrodes and the semiconductor material, an additional ohmic contact layer (not shown) can be formed between the p-type AlGaN layer 106 and the transparent electrode layer 110. The ohmic contact layer may comprise, for example, $In_2O_3$ and at least one of Zn, Mg and Cu.

As shown in FIGS. 2 and 3, a plurality of MIM type tunnel junctions (in this embodiment, two MIM type tunnel junctions) are formed on the n-type GaN layer 103. Each of the MIM type tunnel junctions 200 comprises a lower metal layer 114a, an insulating film 108, and an upper metal layer 110. As a result, the junctions 200 have a metal-insulator-metal (MIM) structure, which is similar to that of a capacitor. However, the junctions 200 are not formed as the capacitor, and are constructed to allow quantum mechanical tunneling upon instantaneous application of high reverse voltage. That is, when a reverse ESD voltage is applied to the light emitting device 300, tunneling current flows through the MIM type tunnel junctions 200, thereby preventing the light emitting device from being damaged by ESD.

According to the present embodiment, the lower metal layer 114a of each MIM type tunnel junction 200 is composed of the same material as that of the n-side electrode 114b. Thus, during the manufacturing process, the lower metal layer 114a and the n-side electrode 114b are formed at the same time. Additionally, the lower metal layer 114a is electrically connected to the n-side electrode 114b via a wire composed of the same material. As for a material of the n-side electrode 114b (thus, the material for the lower metal layer 114a and the wire 114c), Ti, Ni, Au or an AuGe alloy can be used.

The insulating film 108 of the MIM type tunnel junction 200 is formed on the lower metal layer 114a. The insulating film 108 may comprise silicon oxide, aluminum oxide, titanium oxide, silicon nitride, polyimide, or the like. Since the MIM type tunnel junctions 200 are not used as the capacitor, it is not necessary for the MIM type tunnel junction 200 to have a high dielectric constant. In order to ensure tunneling of electrons through the insulating film 108 upon application of reverse ESD voltage, the insulating film preferably has a thickness of 10 to 3,000 Å, and more preferably, a thickness of 100 to 1,000 Å. Additionally, the insulating film 108 may be formed simultaneously with formation of a passivation film (not shown) for protecting the light emitting device, and at this time, the insulating film 108 may comprise the same material as that of the passivation film.

The upper layer of the MIM type tunnel junction 200 may be constituted by the transparent electrode layer 110 formed on the insulating film 108. The transparent film 110 is also formed on the p-type AlGaN layer 106, thus constituting the transparent electrode of the LED, and extends to an upper surface of the insulating film, constituting the upper metal layer of the MIM type tunnel junction 200. Thus, during the manufacturing process, the upper metal layer for realizing the MIM type tunnel junction and the transparent electrode layer for realizing the LED can be formed at the same time. The transparent electrode layer 110 may comprise ITO, $SnO_2$, double layers of Ni/Au, or an alloy of Ni and Au. Thus, the upper metal layer 200 of the MIM type tunnel junction is also composed of any one of these materials. Preferably, the plurality of MIM type tunnel junctions 200 are, as shown in FIG. 2, spaced the same distance from the p-side electrode 112, respectively. In this manner, as the plurality of MIM type tunnel junctions 200 are spaced the same distance from the p-side electrode 112, respectively, a voltage applied to the n-side electrode can be further lowered.

According to the present embodiment, the MIM type tunnel junctions 200 cause most of current to flow therethrough when an instantaneous reverse ESD voltage pulse is generated. Thus, the gallium nitride-based light emitting device is prevented from being damaged. In particular, the two or more MIM type tunnel junctions 200 are located at two or more locations spaced the same distance from the n-side electrode 114b, thereby allowing effective discharge through the MIM type tunnel junctions 200 upon application of the reverse ESD voltage. Moreover, since the lower metal layer 114a, insulating film 108 and upper metal layer 110 of each MIM type tunnel junction 200 can comprise the same material as that of the n-side electrode, passivation film, and transparent electrode layer for realizing the light emitting device, the light emitting device of the invention is appropriate for realizing a simple manufacturing process.

Figure 4:
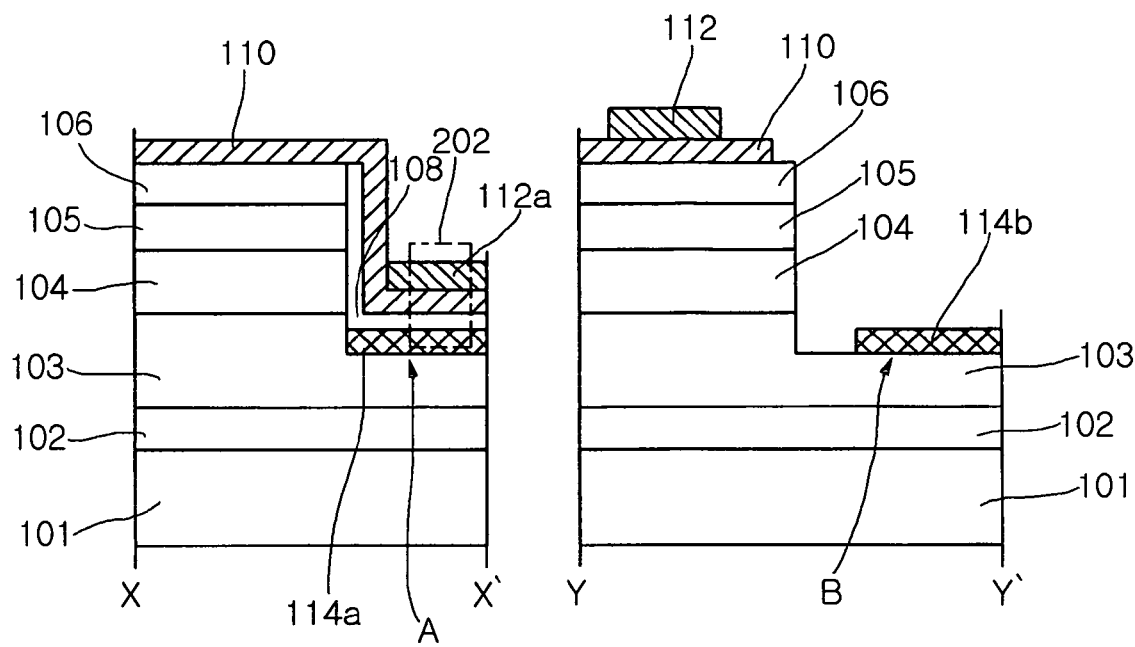
FIG. 4 is a cross-sectional view illustrating a GaN-based light emitting device according to another embodiment of the present invention.

FIG. 4 is a cross-sectional view illustrating a gallium nitride-based light emitting device according to another embodiment of the invention. The gallium nitride-based light emitting device of FIG. 4 is the same as that of FIG. 3, except that it has a metal layer 112a formed on the transparent electrode layer 110. Thus, in the present embodiment, each of the MIM type tunnel junctions 202 has a stacked structure comprising lower metal layer 114a/insulating film 108/transparent electrode film 110/metal layer 112a. At this time, an upper metal layer of the MIM type tunnel junction 202 has a multilayer structure comprising the transparent electrode film 110/metal layer 112a. Additionally, the metal layer 112 formed on the transparent electrode film 110 is composed of the same material as that of the p-side electrode 112. Thus, the metal layer 112a is also formed simultaneously with the p-side electrode 112.

Figure 5:
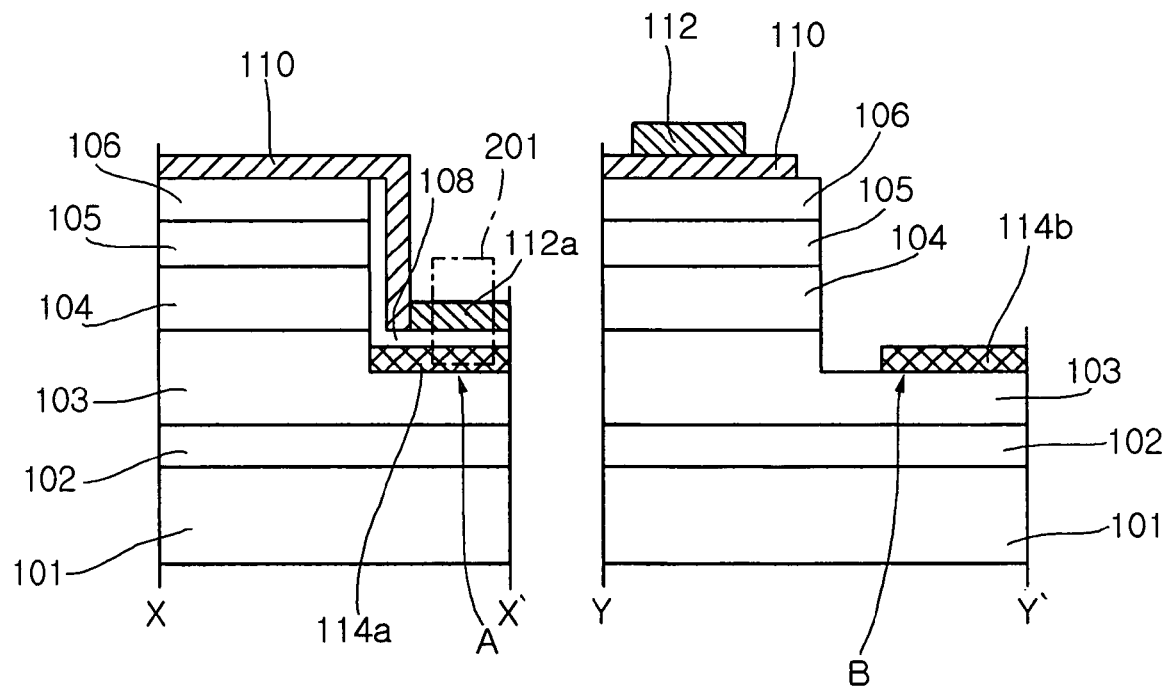
FIG. 5 is a cross-sectional view illustrating a GaN-based light emitting device according to yet another embodiment of the present invention.

FIG. 5 is a cross-sectional view illustrating a gallium nitride-based light emitting device according to yet another embodiment of the invention. The gallium nitride-based light emitting device of FIG. 5 is the same as that of FIG. 3, except that it has a metal layer 112a composed of the same material as that of the p-side electrode 112 and formed directly on the insulating film 108 of each MIM type tunnel junction 201. Thus, in the present embodiment, the MIM type tunnel junctions 201 do not comprise the transparent electrode film 110, and only the metal layer 112a composed of the same material as that of the p-side electrode 112 constitutes the upper metal layer of the MIM type tunnel junctions 201. The metal layer 112a can also be formed simultaneously with the p-side electrode 112. The MIM type tunnel junctions 201 can be formed by selectively removing the transparent electrode layer 110, as described below.

A method for manufacturing a gallium nitride-based light emitting device according to various embodiments of the invention will now be described. FIGS. 6 to 11 are cross-sectional views illustrating the method for manufacturing the gallium nitride-based light emitting device.

Figure 6:
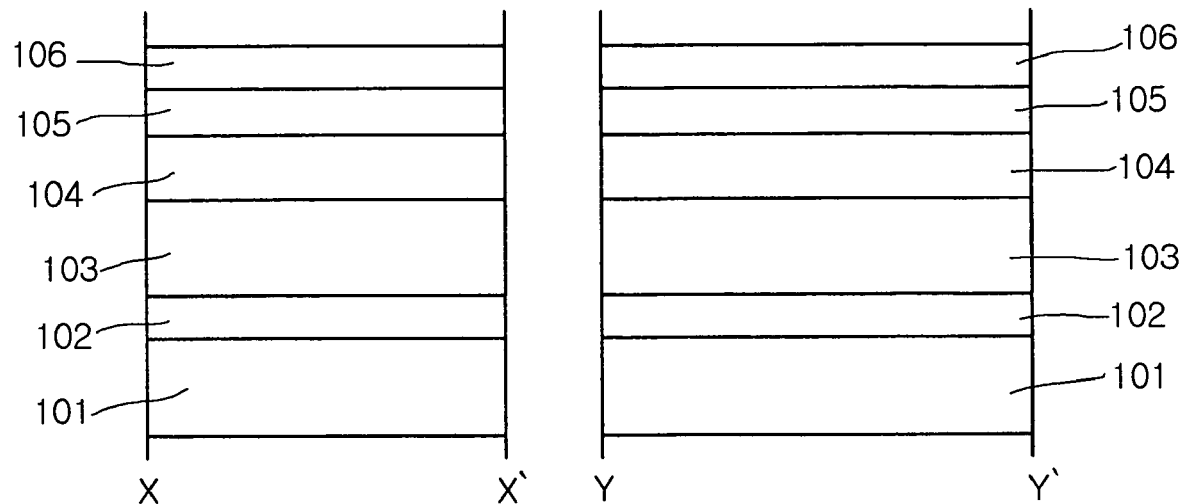
FIGS. 6 to 11 are cross-sectional views illustrating a method for manufacturing a GaN-based light emitting device according to embodiment of the present invention.

First, referring to FIG. 6, a buffer layer 102 is formed on a substrate 101, such as a sapphire substrate. The buffer layer 102 is formed -to relieve lattice mismatch between the substrate and a GaN-based semiconductor, and can be formed of, for example, a GaN layer grown at lower temperature. An n-type GaN layer 103, an n-type AlGaN layer 104, an active layer 105, and a p-type AlGaN layer 106 are sequentially formed on the substrate 101. Here, the active layer 105 can be formed so as to form a stacked structure of a GaN layer and an InGaN layer, and constitute a multi-quantum well. The n-type AlGaN layer 104 may have a doping concentration of, for example, $10^{15}$ to $10^{22}$/ $cm^3$.

Figure 7:
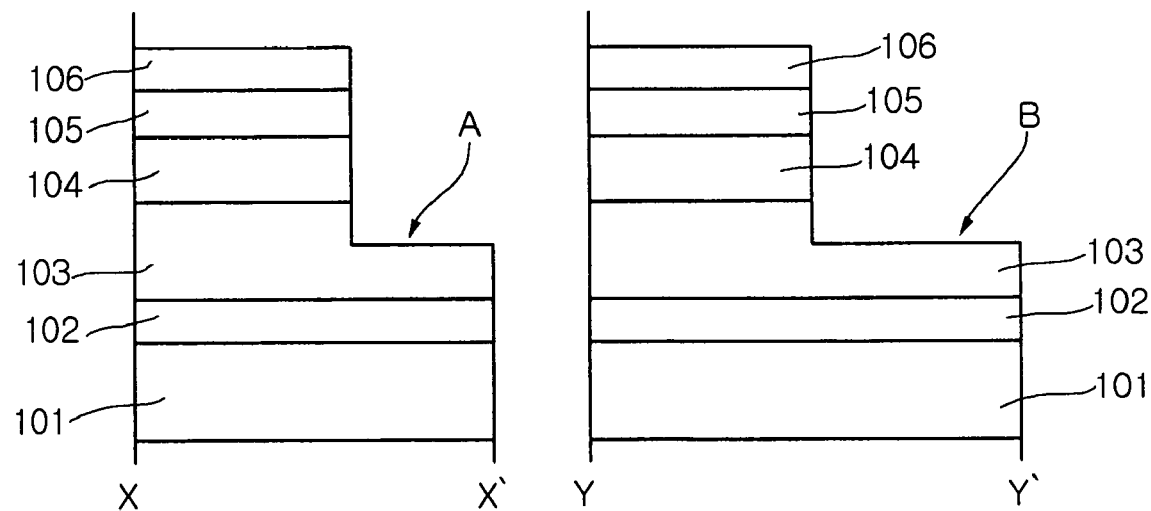

Then, a mesa structure as shown in FIG. 7 is achieved by mesa etching the stacked structure shown in FIG. 6. That is, a portion of the n-type GaN layer 103 is exposed by mesa etching some portion of the p-type AlGaN layer 106, active layer 105, n-type AlGaN layer 104 and n-type GaN layer 103. As a result, as shown in FIG. 7, a portion of the n-type GaN layer 103 is exposed on one region (region A) where a MIM type tunnel junction will be formed, and on another region (region B) where the n-side electrode will be formed. At this time, the n-type GaN layer 103 and the n-type AlGaN layer 104 constitute an n-type GaN-based clad layer of the light emitting device, and the p-type AlGaN layer 106 constitutes a p-type GaN layer thereof.

Figure 8:
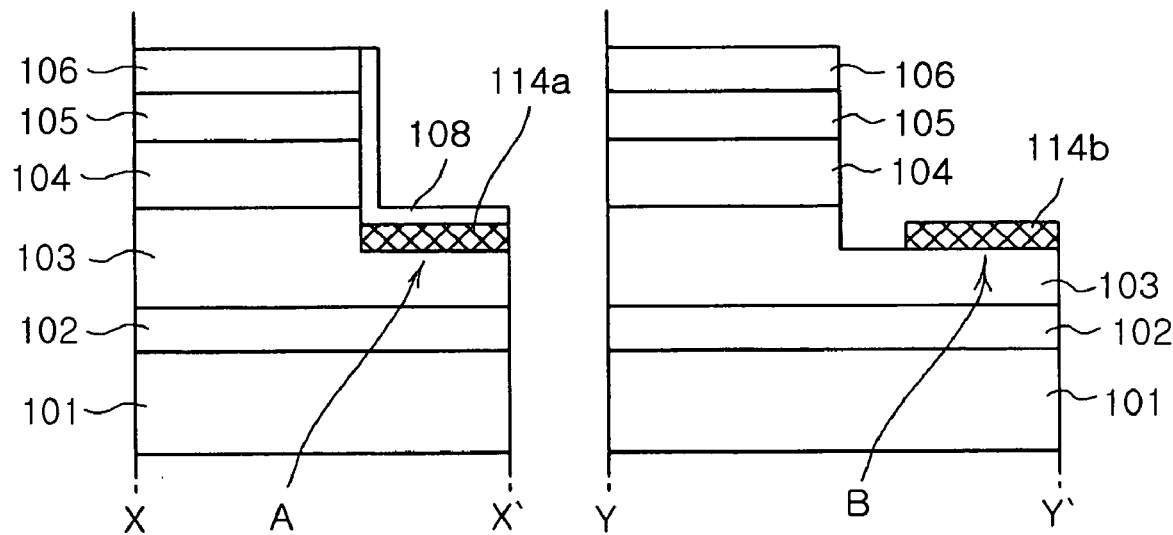

Then, as shown in FIG. 8, an alloy layer of, for example, AuGe is formed on the exposed on the regions A and B of the exposed n-type GaN layer. Accordingly, a lower metal layer 114a of the MIM type tunnel junction is formed on the region A, and an n-side electrode 114b of the light emitting device is formed on the region B. The lower metal layer 114a and the n-side electrode 114b composed of the same material are spaced from each other, as described with reference to FIG. 2, and electrically connected to each other via a wire 114c (see FIG. 2) composed of the same material (AuGe alloy) as that of the lower metal layer 114a and the n-side electrode 114b. Then, an insulating film 108 of $SiO_2$ is formed to a thickness of 1,000 Å on the lower metal layer 114a. Although not shown in the drawings, the insulating film 108 may be formed simultaneously with formation of a passivation film for protecting the light emitting device. In this case, the insulating film 108 may comprise the same material as that of the passivation film.

Figure 9:
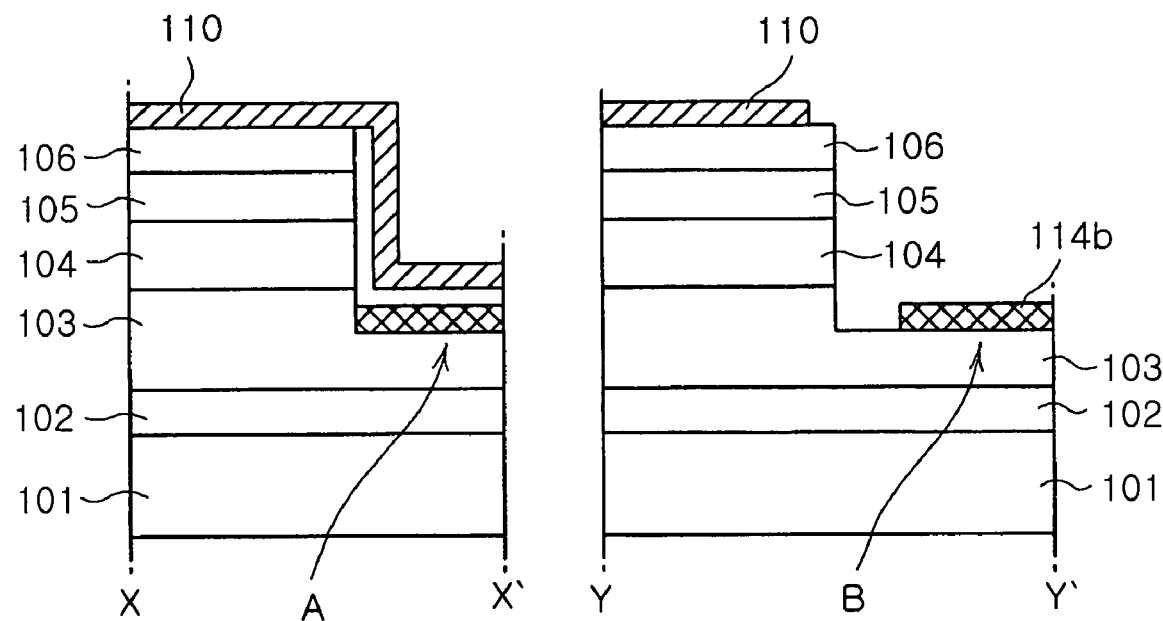

Then, as shown in FIG. 9, a transparent electrode layer 110 comprising, for example, ITO is formed on the p-type AlGaN layer 106, and the insulating film 108. The transparent electrode layer 110 acts as a transparent electrode of a light emitting diode structure on the p-type AlGaN layer 106, and acts as an upper metal layer of the MIM type tunnel junction on the insulating film 108. Thus, as shown in FIG. 9, the MIM type tunnel junction comprising AuGe layer/ $SiO_2$ layer/ITO layer is formed at a location (region A) spaced from the n-side electrode 114b.

Figure 10:
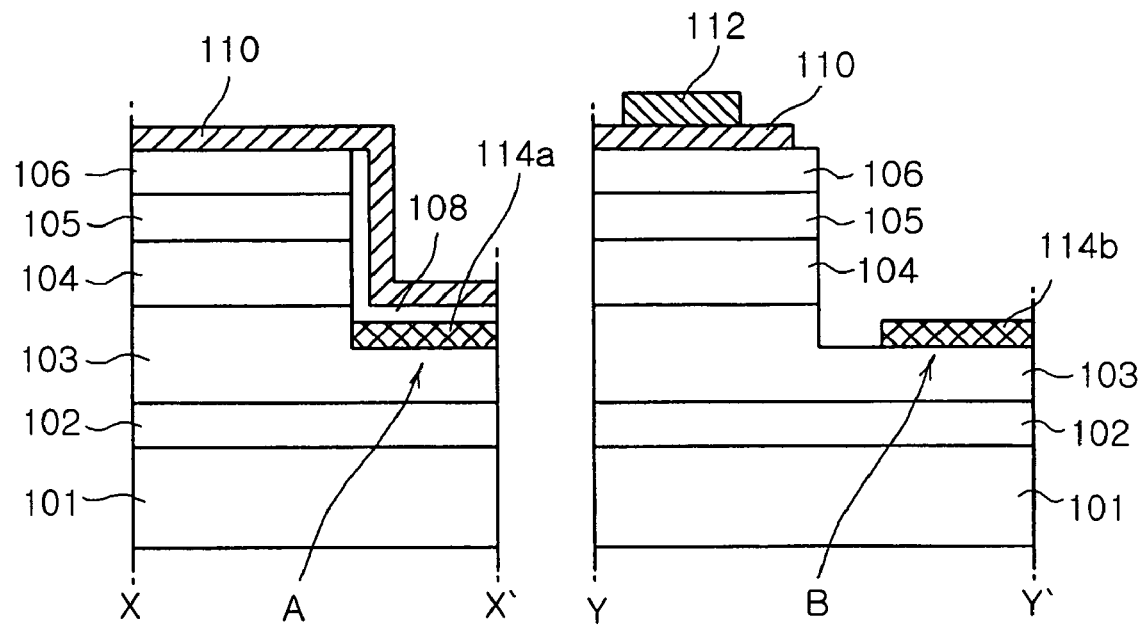

Finally, as shown in FIG. 10, a p-side electrode 112 composed of, for example, a Ti layer, is formed at one side on the transparent film 110 where the p-type AlGaN layer 106 is formed. As a result, the gallium nitride-based light emitting device according to the present embodiment is provided. When a normal forward voltage is applied thereto, normal current flows through the GaN semiconductor materials 103 to 106 in an LED structure (cross section Y-Y' of FIG. 10) of the light emitting device. Since current does not flow through the insulating film 108 in a normal operating current region, the MIM type tunnel junction acts as a kind of current blocking layer. On the contrary, if a reverse ESD voltage is applied thereto, most of the current flows through the MIM type tunnel junction formed in the light emitting device. In other words, upon application of the reverse ESD voltage, the electrons tunnel through the insulating film 108, and flow directly from the lower metal layer 114a to the upper metal layer (that is, the transparent electrode layer 110). Accordingly, the light emitting device can be protected from the reverse ESD voltage.

Figure 11:
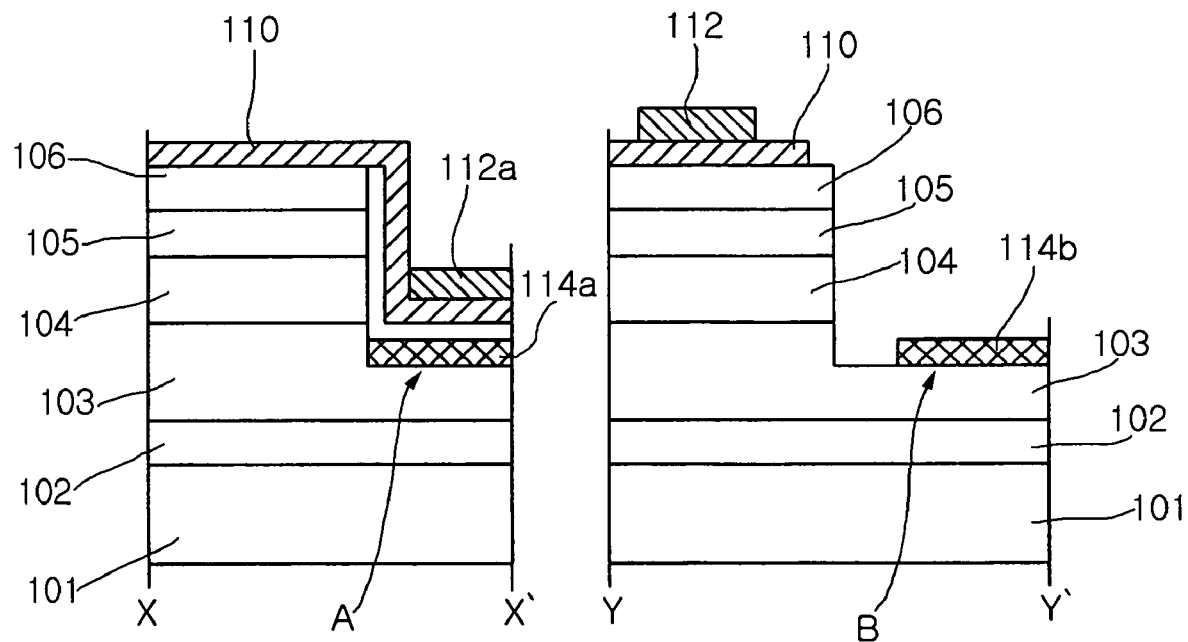

An additional metal layer may be formed on the transparent electrode layer 110 in the region A where the MIM type tunnel junction is formed. FIG. 11 shows a metal layer 112a formed on the transparent electrode layer 110 and composed of the same material as that of the p-side electrode. Specifically, after performing the process described with reference to FIGS. 6 to 9, the metal layer 112a comprising Ti is formed together with the p-side electrode 112 comprising Ti on the transparent electrode layer 110. Thus, an upper metal layer of the MIM type tunnel junction has a multilayer structure of the transparent electrode layer 110 comprising ITO and the metal layer 112a comprising Ti.

Figure 12:
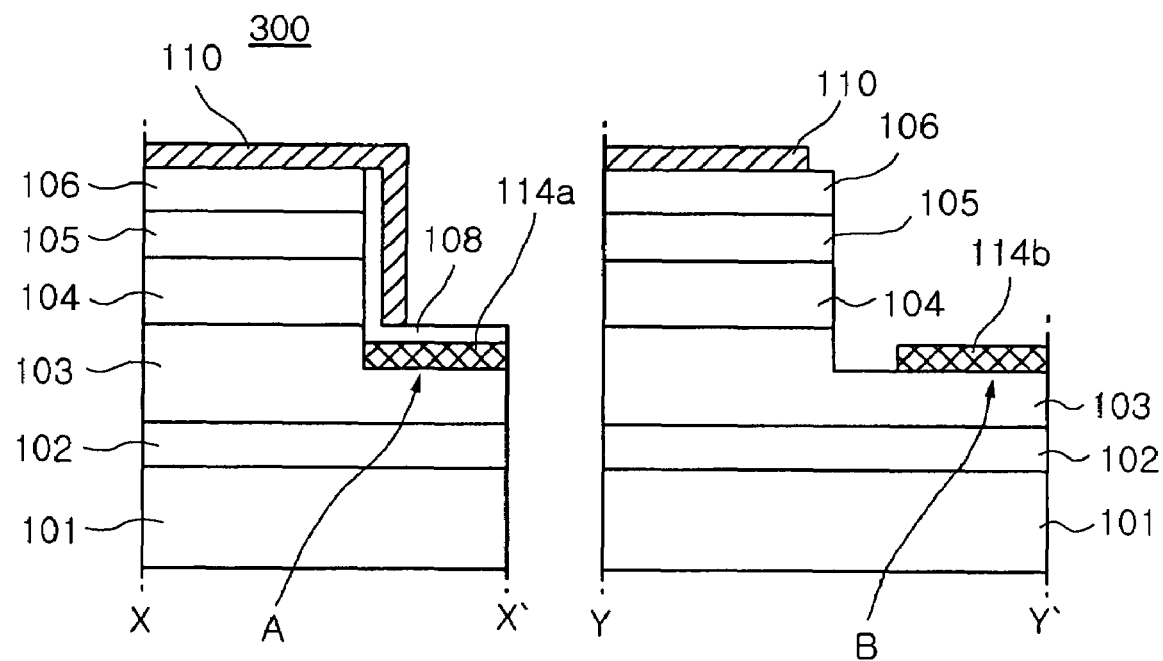
FIGS. 12 and 13 are cross-sectional views illustrating a method for manufacturing a GaN-based light emitting device according to another embodiment of the present invention.
Figure 13:
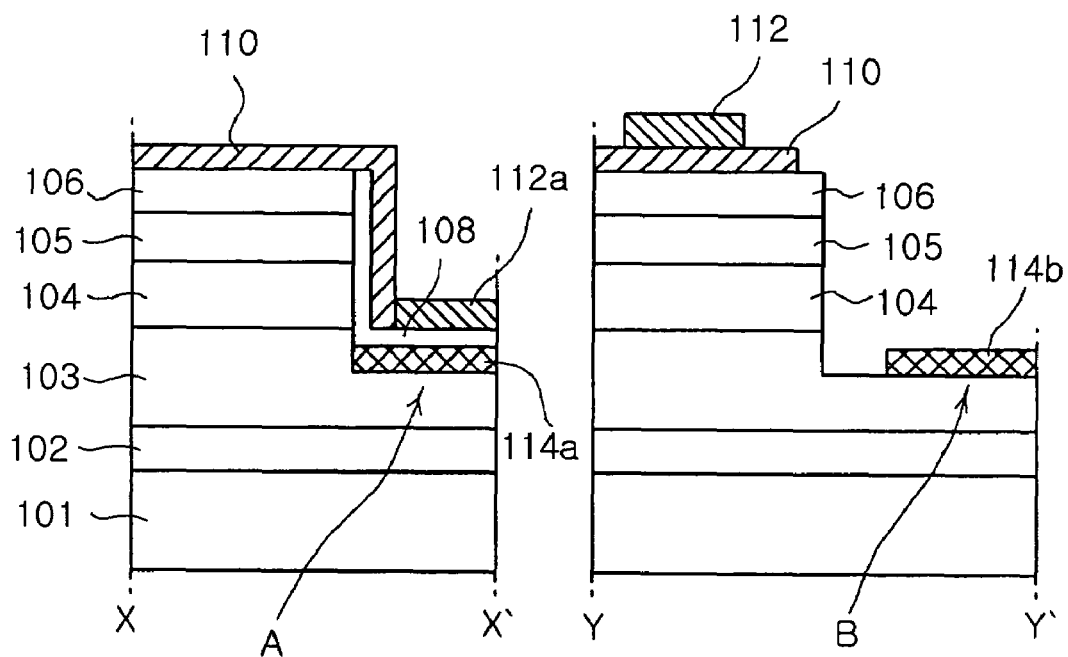

FIGS. 12 and 13 are cross-sectional views illustrating a method for manufacturing a gallium nitride-based light emitting device according to another embodiment. In the method of the present embodiment, the processes described in FIGS. 1 to 9 are also initially performed. Then, as shown in FIG. 12, the transparent electrode layer 110 is selectively etched such that it is removed only from the region A. As a result, the insulating film 108 is exposed in the region A.

Then, as shown in FIG. 12, a p-side electrode comprising Ti is formed at one side of the transparent electrode layer 110, and at the same time, a metal layer 112a comprising Ti is formed on the exposed insulating film 108. As a result, the lower metal layer 114a comprising AuGe, the insulating film 108 comprising $SiO_2$, and the upper metal layer 112a comprising Ti constitute the MIM type tunnel junction.

As apparent from the above description, according to the present invention, an MIM type tunnel junction is directly formed in the gallium nitride-based light emitting device, thereby protecting the light emitting device from reverse ESD voltage. As a result, endurance against the reverse ESD voltage is enhanced, thereby improving reliability of the device. In particular, two or more MIM type tunnel junctions are formed at locations spaced from the n-side electrode, thereby allowing effective discharge therethrough upon application of the reverse ESD voltage. Moreover, the lower metal layer, insulating film and upper metal layer of the MIM type tunnel junction can comprise the same material as that of the n-side electrode, passivation film and transparent electrode layer for realizing the light emitting device, a simple manufacturing process can be realized.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A gallium nitride-based light emitting device comprising an n-type GaN-based clad layer, an active layer, a p-type GaN-based clad layer and a p-side electrode sequentially stacked on a substrate, the light emitting device further comprising:
    an n-side electrode formed on one region of the n-type GaN-based clad layer; and
    two or more MIM type tunnel junctions formed on the other regions of the n-type GaN-based clad layer, wherein each of MIM type tunnel junctions comprises a lower metal layer formed on the n-type GaN-based clad layer and electrically connected to the n-side electrode while being spaced from the n-side electrode, an insulating film formed on the lower metal layer, and an upper metal layer formed on the insulating film.

2. The light emitting device as set forth in claim 1, wherein the upper metal layer has a multilayer structure comprising two or more layers.

3. The light emitting device as set forth in claim 1, wherein the lower metal layer comprises the same material as that of the n-side electrode.

4. The light emitting device as set forth in claim 1, further comprising:
    a transparent electrode layer between the p-type GaN-based clad layer and the p-side electrode.

5. The light emitting device as set forth in claim 4, wherein the transparent electrode layer extends to an upper surface of the insulating film, and constitutes at least a portion of the upper metal layer.

6. The light emitting device as set forth in claim 5, wherein the upper metal layer comprises a metal layer formed on the transparent electrode layer and comprising the same material as that of the p-side electrode.

7. The light emitting device as set forth in claim 4, wherein the upper electrode layer comprises the same material as that of the p-side electrode.

8. The light emitting device as set forth in claim 4, wherein the transparent electrode layer comprises at least one selected from the group consisting of ITO, $SnO_2$, double layers of Ni/Au, an alloy of Ni and Au, ZnO, and MgO.

9. The light emitting device as set forth in claim 1, wherein the two or more MIM type tunnel junctions are spaced the same distance from the p-side electrode.

10. The light emitting device as set forth in claim 1, wherein the p-side electrode comprises at least one selected from the group consisting of Ti, Au, Ni, an alloy of Au and Al, an alloy of Au and Ti, an alloy of Au and Cu, a Mn alloy, a La alloy, a Ni alloy, and a Mg alloy.

11. The light emitting device as set forth in claim 1, wherein the n-side electrode comprises at least one selected from the group consisting of Cr, Ti, Ni, Au, Al, Ta, Hf, AuGe alloy, ZnO, and ITO.

12. The light emitting device as set forth in claim 1, wherein the insulating film comprises a material selected from the group consisting of silicon oxide, aluminum oxide, titanium oxide, silicon nitride and polyimide.

13. The light emitting device as set forth in claim 1, wherein the insulating film has a thickness of 10 to 3,000 Å.

14. The light emitting device as set forth in claim 13, wherein the insulating film has a thickness of 100 to 1,000 Å.

* * * * *